United States Patent
Choi et al.

(10) Patent No.: US 11,530,375 B2
(45) Date of Patent: Dec. 20, 2022

(54) SUBSTRATE CLEANING COMPOSITIONS, SUBSTRATE CLEANING METHOD AND SUBSTRATE TREATING APPARATUS

(71) Applicant: SEMES CO., LTD., Cheonan-si (KR)

(72) Inventors: Hae-Won Choi, Daejeon (KR); Kihoon Choi, Cheonan-si (KR); Jaeseong Lee, Hwaseong-si (KR); Chan Young Heo, Hwaseong-si (KR); Anton Koriakin, Cheonan-si (KR); Do Heon Kim, Cheonan-si (KR); Ji Soo Jeong, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 16/600,166

(22) Filed: Oct. 11, 2019

(65) Prior Publication Data

US 2020/0115660 A1 Apr. 16, 2020

(30) Foreign Application Priority Data

Oct. 11, 2018 (KR) .................. 10-2018-0120914

(51) Int. Cl.
| | | |
|---|---|---|
| *B08B 3/04* | (2006.01) | |
| *C11D 7/50* | (2006.01) | |
| *B08B 3/08* | (2006.01) | |
| *C11D 11/00* | (2006.01) | |
| *H01L 21/02* | (2006.01) | |
| *C11D 7/08* | (2006.01) | |
| *C11D 7/36* | (2006.01) | |
| *H01L 21/67* | (2006.01) | |
| *C11D 7/26* | (2006.01) | |

(52) U.S. Cl.
CPC ............ *C11D 7/5022* (2013.01); *B08B 3/041* (2013.01); *B08B 3/08* (2013.01); *C11D 7/08* (2013.01); *C11D 7/266* (2013.01); *C11D 7/36* (2013.01); *C11D 11/0047* (2013.01); *H01L 21/02101* (2013.01); *H01L 21/67051* (2013.01)

(58) Field of Classification Search
CPC ......... C11D 7/5022; C11D 7/08; C11D 7/266; C11D 7/36; C11D 11/0047; B08B 3/041; B08B 3/08; H01L 21/02101; H01L 21/67051
See application file for complete search history.

(56) References Cited

U.S. PATENT DOCUMENTS

| | | | | |
|---|---|---|---|---|
| 6,146,815 A | * | 11/2000 | Komatsu | ............... G03F 7/325 430/331 |
| 6,255,228 B1 | * | 7/2001 | Rolfson | ............ H01L 21/67051 427/126.1 |

(Continued)

FOREIGN PATENT DOCUMENTS

| | | |
|---|---|---|
| JP | 2013-540171 A | 10/2013 |
| KR | 100649418 B1 | 11/2006 |

(Continued)

*Primary Examiner* — Sharidan Carrillo
(74) *Attorney, Agent, or Firm* — Procopio, Cory, Hargreaves & Savitch LLP (57) ABSTRACT

A composition for cleaning a substrate is provided. According to an embodiment, the composition for cleaning the substrate includes an organic solvent having a Hansen solubility parameter of 5 or more to 12 or less for polystyrene latex to the substrate.

8 Claims, 6 Drawing Sheets

(56) References Cited

U.S. PATENT DOCUMENTS

| | | | | |
|---|---|---|---|---|
| 2004/0055621 A1* | 3/2004 | McDermott | ............ | C11D 7/261 |
| | | | | 134/1.3 |
| 2004/0105936 A1* | 6/2004 | Muraoka | ............ | H01L 21/67051 |
| | | | | 427/372.2 |
| 2006/0138399 A1* | 6/2006 | Itano | ............ | C11D 7/265 |
| | | | | 257/40 |
| 2009/0246958 A1* | 10/2009 | Burns | ............ | H01L 21/0276 |
| | | | | 438/694 |
| 2018/0373154 A1* | 12/2018 | Choi | ............ | H01L 21/67742 |
| 2020/0026194 A1* | 1/2020 | Choi | ............ | G03F 7/40 |
| 2020/0035494 A1* | 1/2020 | Wojtczak | ............ | C09D 5/00 |
| 2020/0115660 A1* | 4/2020 | Choi | ............ | H01L 21/02057 |

FOREIGN PATENT DOCUMENTS

| | | |
|---|---|---|
| KR | 10-2012-0133077 A | 12/2012 |
| KR | 101631359 B1 | 6/2016 |
| KR | 10-2016-0132772 A | 11/2016 |
| KR | 10-2018-0021215 A | 2/2018 |
| KR | 10-2018-0036263 A | 4/2018 |
| KR | 10-1847208 B | 4/2018 |
| KR | 10-2019-0030609 A | 3/2019 |
| KR | 10-1966808 B | 4/2019 |

* cited by examiner

SUBSTRATE CLEANING COMPOSITIONS, SUBSTRATE CLEANING METHOD AND SUBSTRATE TREATING APPARATUS

CROSS-REFERENCE TO RELATED APPLICATIONS

A claim for priority under 35 U.S.C. § 119 is made to Korean Patent Application No. 10-2018-0120914 filed on Oct. 11, 2018, in the Korean Intellectual Property Office, the entire contents of which are hereby incorporated by reference.

BACKGROUND

Embodiments of the inventive concept described herein relate to a substrate cleaning composition, a method of processing a substrate, and an apparatus for processing a substrate.

A semiconductor device is manufactured through various processes, including photolithography, which forms a circuit pattern on a substrate such as a silicon wafer. During a process of manufacturing of the semiconductor device, various foreign substances such as particles, organic contaminants, and metal impurities are generated. These foreign substances cause defects on the substrate and directly affect performance and yield of the semiconductor device. Therefore, the process of manufacturing the semiconductor device is necessarily accompanied by a cleaning process for removing the foreign substances.

The cleaning process is performed through a chemical process for removing the foreign substances on the substrate with a chemical, a cleaning process for cleaning the chemical with pure water, and a drying process for drying the substrate. The general drying process includes replacing pure water on the substrate with an organic solvent such as isopropyl alcohol (IPA) having a relatively low surface tension and evaporating the organic solvent. In addition, although the organic solvent is used in the drying process, pattern leaning and collapse may still occur for the semiconductor device having a fine circuit pattern, which has a critical dimension of 100 nm or less.

SUMMARY

Embodiments of the inventive concept provide a substrate cleaning composition, in which the substrate is efficiently processed, a method of processing a substrate, and an apparatus for processing a substrate.

Embodiments of the inventive concept provide a substrate cleaning composition in which cleaning efficiency is improved, a method of processing a substrate, and an apparatus for processing a substrate.

Embodiments of the inventive concept provide a substrate cleaning composition in which pattern collapse is prevented, a method of processing a substrate, and an apparatus for processing a substrate.

Embodiments of the inventive concept provide a substrate cleaning composition capable of effectively removing particles each having nano-scale size (100 nm or less), a method of processing a substrate, and an apparatus for processing a substrate.

Embodiments of the inventive concept provide a substrate cleaning composition, which is capable of removing an organic residue of a deep trench without pattern collapse while damage and loss to a silicon-based layer ($SiO_2$, $Si_3N_4$) does not occur, a method of processing a substrate, and an apparatus for processing a substrate.

According to an exemplary embodiment, a method of processing a substrate includes applying a cleaning composition including an organic solvent having a Hansen solubility parameter of 5 or more to 12 or less for polystyrene latex to the substrate.

According to an embodiment, the organic solvent may include one of n-butyl acetate, diethyl malonate, isopropyl acetate, or a combination thereof.

According to an embodiment, the organic solvent may have a surface tension of 30 dyn/cm or less.

According to an embodiment, the cleaning composition may be provided by dissolving an etching compound including fluorine in the organic solvent.

According to an embodiment, the cleaning composition may further include a binder provided in a compound including phosphorus.

According to an embodiment, the binder may include trimethyl phosphate.

According to an embodiment, the cleaning composition may be provided in an anhydrous composition containing no water as a component.

According to an embodiment, the method may further include supplying a supercritical fluid to the substrate to which the cleaning composition is applied to process the substrate.

According to an embodiment, the method may further include rinsing the substrate to which the cleaning composition is applied with the organic solvent before the supplying of the supercritical fluid.

According to an embodiment, the cleaning composition may be supplied while the substrate is rotated.

According to an exemplary embodiment, a composition for cleaning a substrate includes an organic solvent having a Hansen solubility parameter of 5 or more to 12 or less for polystyrene latex to the substrate.

According to an embodiment, the organic solvent may include one of n-butyl acetate, diethyl malonate, isopropyl acetate, or a combination thereof.

According to an embodiment, the organic solvent may have a surface tension of 30 dyn/cm or less.

According to an embodiment, the cleaning composition may be provided by dissolving an etching compound including fluorine in the organic solvent.

According to an embodiment, the cleaning composition may further include a binder provided in a compound including phosphorus.

According to an embodiment, the binder may include trimethyl phosphate.

According to an embodiment, the cleaning composition may be provided in an anhydrous composition containing no water as a component.

According to an exemplary embodiment, an apparatus for processing a substrate includes a first process chamber, a support unit that is disposed inside the first process chamber to support the substrate, and a fluid supply unit that supplies a cleaning composition to the substrate supported by the support unit.

According to an embodiment, the apparatus may further include a second process chamber and a supercritical fluid supply unit that supplies a supercritical fluid to the substrate disposed in the second process chamber.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described with reference to the accompanying drawings in more detail. The embodiments of the inventive concept may be modified in various forms, and the scope of the inventive concept should not be construed as being limited to the following embodiments. The embodiments are provided to more completely explain the inventive concept to those skilled in the art. Therefore, shapes of elements in the drawings are exaggerated to emphasize a more clear description.

Hereinafter, an apparatus for processing a substrate according to the inventive concept will be described.

The apparatus for processing the substrate may perform a supercritical process in which the substrate is processed using a supercritical fluid as a process fluid.

Here, the substrate is a comprehensive concept including all of a semiconductor device or a flat panel display (FPD) and other substrates used for a manufacture of articles formed with circuit patterns on a thin film. Examples of a substrate 'S' include a silicon wafer, a glass substrate, an organic substrate, and the like.

Figure 1:
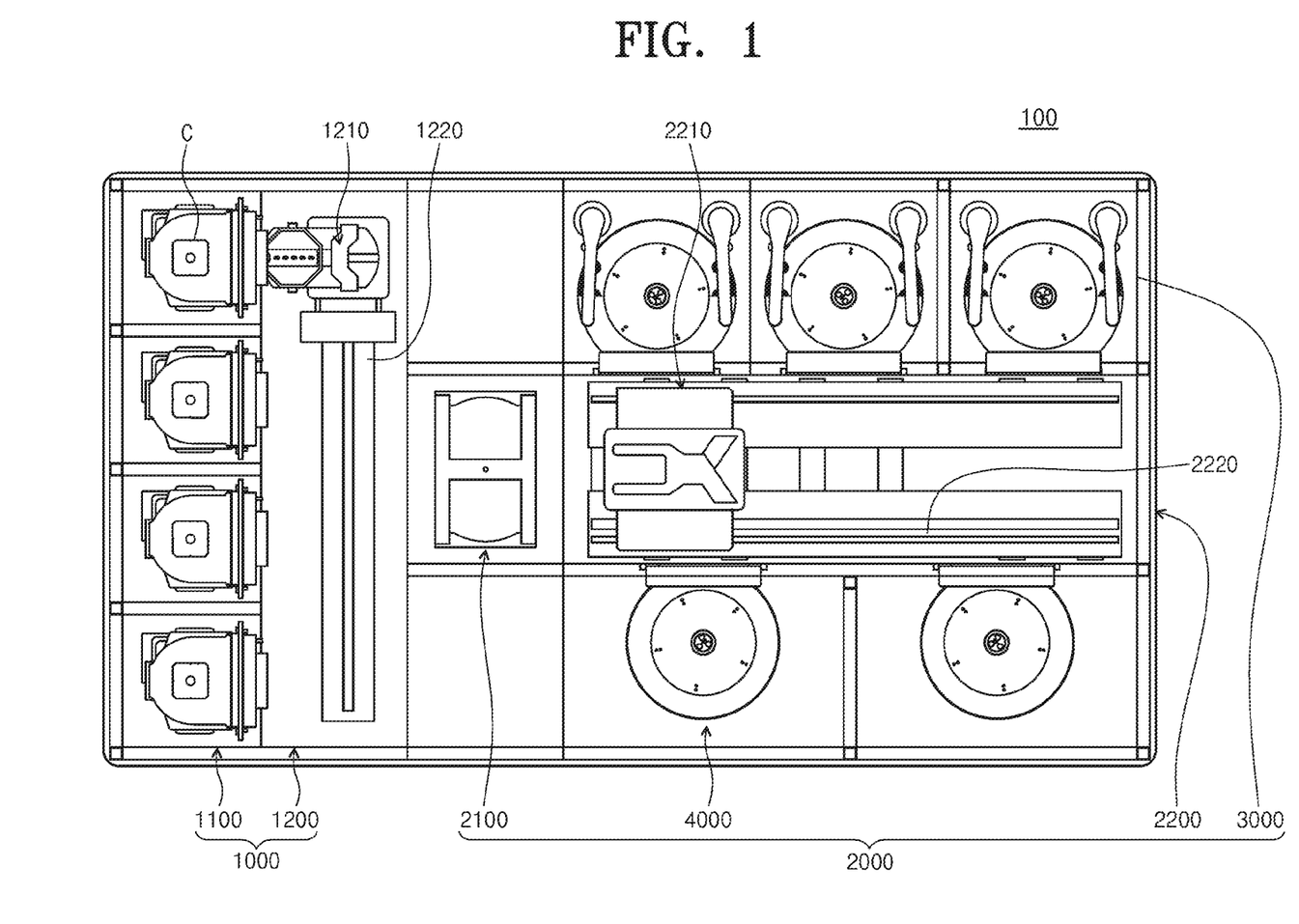
FIG. 1 is a plan view illustrating an apparatus for processing a substrate according to an embodiment of the inventive concept.

FIG. 1 is a plan view illustrating an apparatus for processing a substrate according to an embodiment of the inventive concept.

Referring to FIG. 1, an apparatus 100 for processing a substrate includes an index module 1000 and a processing module 2000.

The index module 1000 receives the substrate 'S' from the outside and conveys the substrate 'S' to the processing module 2000. The processing module 2000 may perform a substrate processing process using a supercritical fluid.

The index module 1000 is an equipment front end module (EFEM) and includes a load port 1100 and a transfer frame 1200.

A container 'C' in which the substrate 'S' is accommodated is placed at the load port 1100. A front opening unified pod (FOUP) may be used as the container 'C'. The container 'C' may be carried in or out of the load port 1100 from the outside by an overhead transfer (OHT).

The transfer frame 1200 conveys the substrate 'S' between the container 'C' placed in the load port 1100 and the processing module 2000. The transfer frame 1200 includes an index robot 1210 and an index rail 1220. The index robot 1210 may move on the index rail 1220 and carry the substrate 'S'.

The processing module 2000 includes a buffer chamber 2100, a transfer chamber 2200, a first process chamber 3000, and a second process chamber 4000.

The buffer chamber 2100 provides a space in which the substrate 'S' transferred between the index module 1000 and the processing module 2000 stays temporarily. A buffer slot may be provided in the buffer chamber 2100. The substrate 'S' is placed in the buffer slot. For example, the index robot 1210 may withdraw the substrate 'S' from the container 'C' and place the substrate 'S' in the buffer slot. The transfer robot 2210 of the transfer chamber 2200 may withdraw the substrate 'S' placed in the buffer slot and transfer the substrate 'S' to the first process chamber 3000 or the second process chamber 4000. A plurality of buffer slots may be provided in the buffer chamber 2100, and thus a plurality of substrates 'S' may be placed.

The transfer chamber 2200 conveys the substrate 'S' between the buffer chamber 2100, the first process chamber 3000, and the second process chamber 4000, which are disposed around the transfer chamber 2200. The transfer chamber 2200 includes the transfer robot 2210 and a transfer rail 2220. The transfer robot 2210 may transfer the substrate 'S' while moving on the transfer rail 2220.

The first process chamber 3000 and the second process chamber 4000 may perform a cleaning process using a process fluid. The cleaning process may be sequentially performed in the first process chamber 3000 and the second process chamber 4000. For example, a cleaning process may be performed in the first process chamber 3000, and a supercritical drying process may be performed in the second process chamber 4000. In addition, the cleaning process and the drying process may be performed in the second process chamber 4000.

The first process chamber 3000 and the second process chamber 4000 are disposed at sides of the transfer chamber 2200, respectively. For example, the first process chamber 3000 and the second process chamber 4000 may be disposed to face each other on opposite sides of the transfer chamber 2200.

The processing module 2000 may include a plurality of first process chambers 3000 and second process chambers 4000. The plurality of process chambers 3000 and 4000 may be arranged in a row at the sides of the transfer chamber 2200, may be stacked up and down at the sides of the transfer chamber 2200, or may be arranged in a combination thereof.

An arrangement of the first process chamber 3000 and the second process chamber 4000 may be not limited to the above-described example, and may be changed in consideration of a footprint or processing efficiency of the apparatus 100 for processing the substrate 'S'. The apparatus 100 for processing the substrate 'S' may be controlled by a controller.

Figure 2:
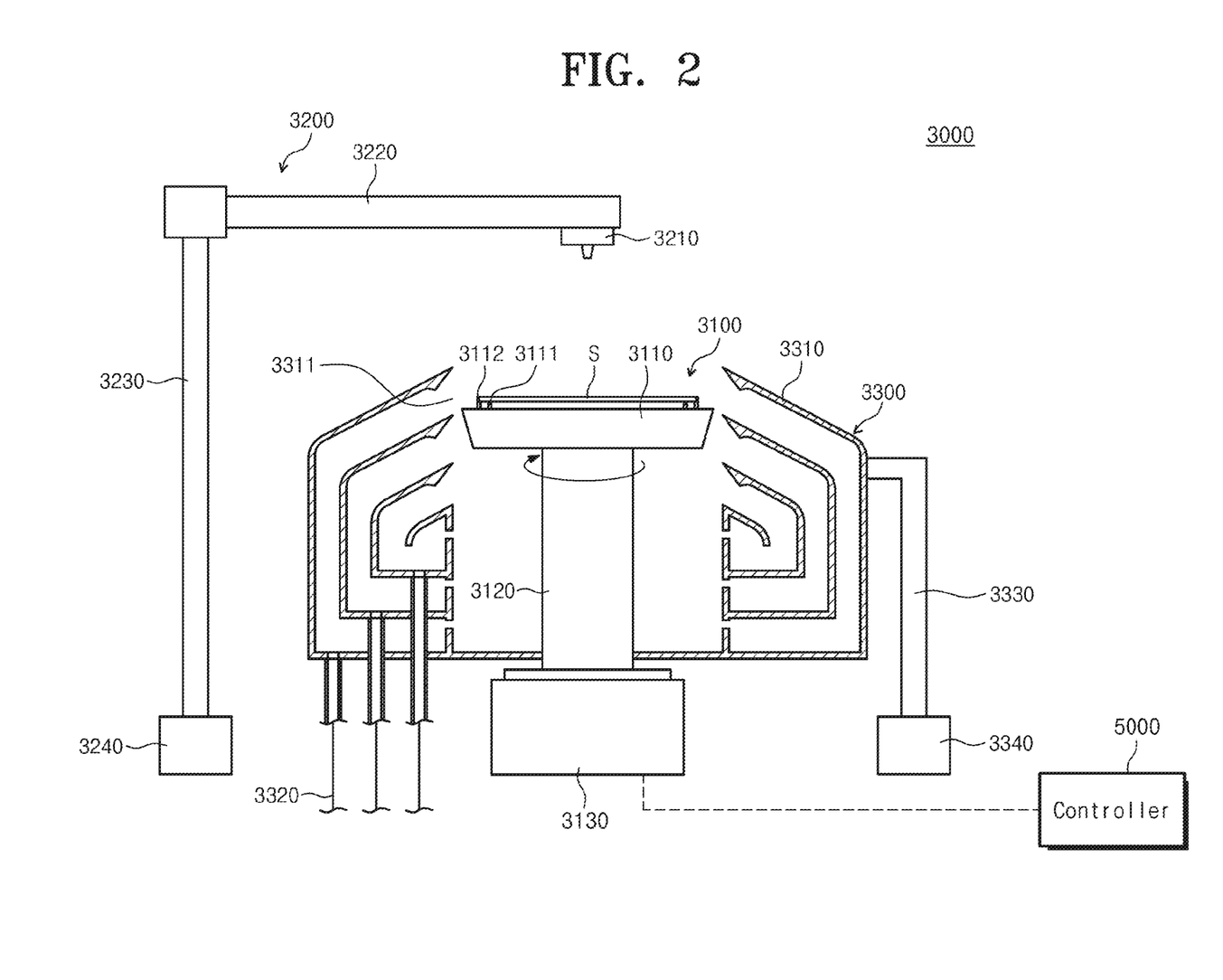
FIG. 2 is a cross-sectional view of the first process chamber of FIG. 1.

FIG. 2 is a cross-sectional view of the first process chamber of FIG. 1.

Referring to FIG. 2, the first process chamber 3000 includes a support unit 3100, a nozzle unit 3200, and a recovery unit 3300.

The first process chamber 3000 may perform cleaning of the substrate through a substrate cleaning composition. A process performed in the first process chamber 3000 is performed by an anhydrous process using no water. Conventional chemical solutions such as standard clean (SC)-1 and dilute hydrofluoric acid (DHF) include water as a component. A pattern formed on the substrate is gradually refined and a critical dimension of the pattern becomes small. The water has a low penetration force into a narrow space between the patterns due to surface tension, and thus cleaning efficiency for the space between the patterns is low. In addition, after the conventional cleaning using the chemical solutions such as SC-1 and DHF, a drying process is performed by substituting the chemical solutions with deionized water and pattern leaning and pattern collapse may occur in the drying process. Meanwhile, since the substrate cleaning composition according to the inventive concept includes no water, the problem caused by the water contained in the conventional chemical solutions does not occur.

The support unit 3100 supports the substrate 'S'. The support unit 3100 may rotate the supported substrate 'S'. The support unit 3100 includes a support plate 3110, a support pin 3111, a chuck pin 3112, a rotation shaft 3120, and a rotation driver 3130.

The support plate 3110 has an upper surface of the same or similar shape as the substrate 'S'. The support pin 3111 and the chuck pin 3112 are formed on the upper surface of the support plate 3110. The support pin 3111 supports a bottom surface of the substrate 'S'. The chuck pin 3112 may fix the supported substrate 'S'.

The rotation shaft 3120 is connected to a lower portion of the support plate 3110. The rotation shaft 3120 receives a rotational force from the rotation driver 3130 to rotate the support plate 3110. Accordingly, the substrate 'S' seated on the support plate 3110 may rotate. The chuck pin 3112 prevents the substrate 'S' from leaving in position.

The nozzle unit 3200 sprays the substrate cleaning composition onto the substrate 'S'. The nozzle unit 3200 includes a nozzle 3210, a nozzle bar 3220, a nozzle shaft 3230, and a nozzle shaft driver 3240.

The nozzle 3210 sprays the substrate cleaning composition onto the substrate 'S' seated on the support plate 3110. The nozzle 3210 is formed at a bottom of one end of the nozzle bar 3220. The nozzle bar 3220 is coupled to the nozzle shaft 3230. The nozzle shaft 3230 is provided to be capable of being lifted or rotated. The nozzle shaft driver 3240 may adjust a position of the nozzle 3210 by lifting or rotating the nozzle shaft 3230.

The recovery unit 3300 recovers the substrate cleaning composition supplied to the substrate 'S'. When the substrate cleaning composition is supplied to the substrate 'S' by the nozzle unit 3200, the support unit 3100 may rotate the substrate 'S' and the substrate cleaning composition is uniformly supplied to all regions of the substrate 'S'. When the substrate 'S' rotates, the substrate cleaning composition is scattered from the substrate 'S'. The scattering substrate cleaning composition may be recovered by the recovery unit 3300.

The recovery unit 3300 includes a recovery container 3310, a recovery line 3320, a lifting bar 3330, and a lifting driver 3340.

The recovery container 3310 is provided in an annular ring shape surrounding the support plate 3110. The recovery container 3310 may be provided in plurality. The plurality of recovery containers 3310 are provided in ring shapes away from the support plate 3110 in order when viewed from the top. As the recovery container 3310 becomes further away from the support plate 3110, a height of the recovery container 3310 becomes higher. A recovery hole 3311, into which the substrate cleaning composition scattered from the substrate 'S' is introduced, is formed at a space between the recovery containers 3310.

The recovery line 3320 is formed at a bottom surface of the recovery container 3310.

The lifting bar 3330 is connected to the recovery container 3310. The lifting bar 3330 receives power from the lifting driver 3340 to move the recovery container 3310 up and down. When the recovery container 3310 is plural, the lifting bar 3330 may be connected to the outmost recovery container 3310. The lifting driver 3340 may lift the recovery container 3310 through the lifting bar 3330 to adjust the recovery hole 3311 into which the scattering substrate cleaning composition is introduced among a plurality of recovery holes 3311.

The substrate cleaning composition according to an embodiment of the inventive concept includes an organic solvent, a binder, and an etching compound. Hereinafter, a detailed description will be given with reference to FIG. 7.

Figure 3:
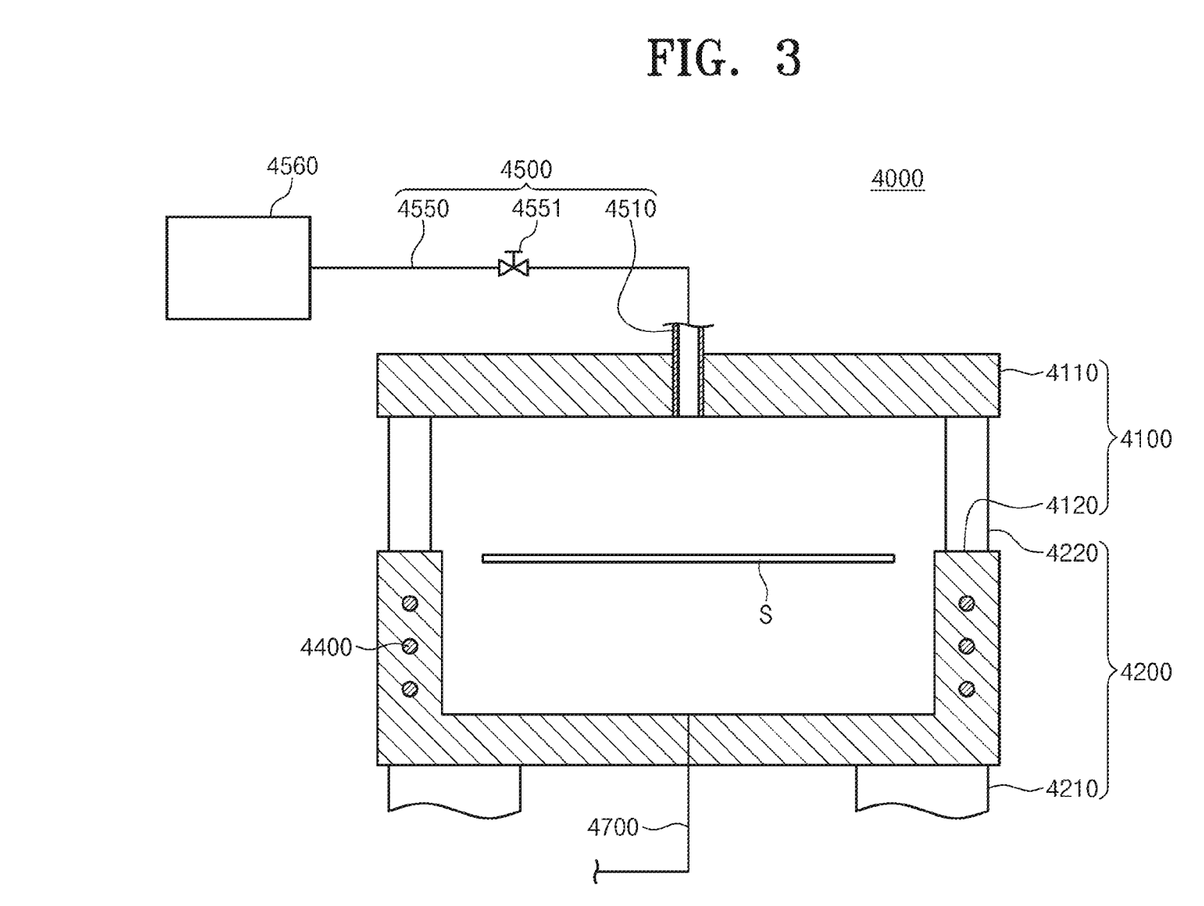
FIG. 3 is a cross-sectional view of an embodiment of the second process chamber of FIG. 1.

FIG. 3 is a cross-sectional view of an embodiment of the second process chamber of FIG. 1.

Referring to FIG. 3, the second process chamber 4000 includes a chamber 4100, a lifting unit 4200, a support unit (not shown), a heating member 4400, a fluid supply unit 4500, and a blocking member (not shown), and an exhaust member 4700. The second process chamber 4000 performs a process of processing the substrate using the supercritical fluid.

The chamber 4100 provides a processing space in which a supercritical process is performed. The chamber 4100 is made of a material, which is capable of withstanding a high pressure above a critical pressure.

The chamber 4100 includes an upper body 4110 and a lower body 4120. The lower body 4120 is provided in combination with the upper body 4110 below the upper body 4110. A space generated by combining the upper body 4110 and the lower body 4120 is provided as the processing space for performing a substrate processing process.

The upper body 4110 is installed to be fixed to an external structure. The lower body 4120 is provided to be elevatable with respect to the upper body 4110. When the lower body 4120 descends and is spaced apart from the upper body 4110, the processing space is opened in the second process chamber 4000. Through the open processing space, the substrate 'S' may be introduced into an interior space of the second process chamber 4000 or may be discharged from the interior space.

When the lower body 4120 ascends and is in close contact with the upper body 4110, the processing space inside the second process chamber 4000 is sealed. In an enclosed processing space, the substrate may be processed via the supercritical fluid. Unlike the above-described example, the lower body 4120 may be fixedly installed in the chamber 4100 and may be provided in a structure in which the upper body 4110 is elevated.

The lifting unit 4200 elevates the lower body 4120. The lifting unit 4200 includes a lifting cylinder 4210 and a lifting rod 4220. The lifting cylinder 4210 is coupled to the lower body 4120 to generate a driving force in a vertical direction. While the substrate processing is performed using the supercritical fluid, the lifting cylinder 4210 generates a driving force to overcome the high pressure above the critical pressure inside the second process chamber 4000 and to seal the second process chamber 4000 in which the upper body 4110 and the lower body 4120 are in close contact with each other. One end of the lifting rod 4220 is inserted into the lifting cylinder 4210 and is extended vertically to couple the other end of the lifting rod 4220 to the upper body 4110. When the driving force is generated in the lifting cylinder 4210, the lifting cylinder 4210 and the lifting rod 4220 may be relatively raised to ascend the lower body 4120 coupled to the lifting cylinder 4210. The lifting rod 4220 may prevent the upper body 4110 and the lower body 4120 from moving in a horizontal direction during lifting the lower body 4120 by the lifting cylinder 4210 and may guide a lifting direction to prevent the upper body 4110 and the lower body 4120 from leaving in position.

The support unit (not shown) is located in the processing space of the chamber 4100 and supports the substrate 'S'. The support unit (not shown) is coupled to the upper body 4110 or the lower body 4120.

The support unit (not shown) contacts a peripheral region of the substrate 'S' to support the substrate 'S'. In the supported substrate 'S', the substrate processing may be performed in the entire region of the upper surface and the most region of the lower surface through the supercritical fluid. Here, the upper surface of the substrate 'S' may be a patterned surface, and the lower surface of the substrate 'S' may be a non-patterned surface.

The heating member 4400 heats an interior of the second process chamber 4000. The heating member 4400 maintains a supercritical fluid state by heating the supercritical fluid supplied into the second process chamber 4000 at the critical temperature or more. When the supercritical fluid is liquefied, the heating member 4400 may heat the supercritical fluid to become the supercritical fluid again. The heating member 4400 is embedded in at least one wall of the upper body 4110 and the lower body 4120. The heating member 4400 receives power from the outside to generate heat. For example, the heating member 4400 may be provided as a heater.

The fluid supply unit 4500 supplies a fluid to the second process chamber 4000. The fluid supplied may be the supercritical fluid. As an example, the supplied supercritical fluid may be carbon dioxide. In addition, the fluid supply unit 4500 may mix the supercritical fluid and the substrate cleaning composition to be supplied.

The fluid supply unit 4500 includes a fluid supply port 4510, a supply line 4550, and a valve 4551.

The fluid supply port 4510 supplies the supercritical fluid directly to the upper surface of the substrate 'S'. The fluid supply port 4510 is provided to be connected to the upper body 4110. The fluid supply port 4510 may further include a lower fluid supply port (not shown) connected to the lower body 4120. The supercritical fluid sprayed from the fluid supply port 4510 reaches a center region of the substrate 'S' and spreads to the peripheral region of the substrate 'S' to be uniformly provided to the entire region of the substrate 'S'.

The supply line 4550 is connected to the fluid supply port 4510. The supply line 4550 receives the supercritical fluid from a separate supercritical fluid storage unit 4560 to supply the supercritical fluid to the fluid supply port 4510. For example, the supercritical fluid storage unit 4560 may store the supercritical fluid, which is carbon dioxide, and supply the stored supercritical fluid to the supply line 4550.

The valve 4551 is installed in the supply line 4550. The valve 4551 may be provided in plural at the supply line 4550. Each valve 4551 adjusts a flow rate of the supercritical fluid supplied to the fluid supply port 4510. The valve 4551 may adjust the flow rate supplied into the chamber 4100 by a controller 5000.

The blocking member (not shown) prevents the supercritical fluid supplied from the fluid supply unit 4500 from being directly sprayed onto the substrate 'S'. The blocking member (not shown) is located at the processing space in the chamber 4100. The blocking member (not shown) is disposed between the support unit (not shown) and the fluid supply port 4510. The blocking member (not shown) may be provided in a circular plate shape.

The exhaust member 4700 exhausts the supercritical fluid from the second process chamber 4000. The exhaust member 4700 may be connected to an exhaust line (not shown) for exhausting the supercritical fluid. Here, a valve (not shown) for adjusting a flow rate of the supercritical fluid exhausted to the exhaust line (not shown) may be installed in the exhaust member 4700. The supercritical fluid exhausted through the exhaust line (not shown) may be released into the atmosphere or supplied to a supercritical fluid regeneration system (not shown). The exhaust member 4700 may be coupled to the lower body 4120.

In the later stage of the substrate processing process through the supercritical fluid, the supercritical fluid may be exhausted from the second process chamber 4000 and an internal pressure of the second process chamber 4000 may be reduced to below the critical pressure to liquefy the supercritical fluid. The liquefied supercritical fluid may be discharged through the exhaust member 4700 formed in the lower body 4120 by gravity.

The substrate cleaning composition may include an organic solvent having a Hansen solubility parameter (HSP) of 5 or more and 12 or less for a polystyrene latex particle.

The Hansen solubility parameter (HSP) is an index indicating solubility characteristics proposed by Dr. C. Hansen in 1967. In the HSP, a degree of binding in a substance is subdivided into three factors as follows:

(1) a solubility factor ($\delta D$) due to nonpolar dispersion bonding
(2) a solubility factor ($\delta P$) due to polar bonding of permanent dipoles
(3) a solubility factor ($\delta H$) due to hydrogen bonding The HSP is widely used because the HSP provides more detailed binding information in the substance than other solubility factors, and thus more accurately and systematically evaluates the solubility of the substance.

$$HSP = (\delta D, \delta P, \delta H), (J/cm^3)^{1/2}$$

$$\delta Tot = (4\delta D2 + \delta P2 + \delta H2)^{1/2}, (J/cm^3)^{1/2}$$

The HSP is a vector having a size and a direction in a space consisting of three elements, $\delta Tot$ represents a magnitude of the HSP vector or a distance between the factors. A basic unit representing the HSP is $(J/cm^3)^{1/2}$ or $(MPa)^{1/2}$. This HSP value may be calculated using a program called Hansen solubility parameters in practice (HSPiP) developed by Dr. Hansen Group who proposed the HSP.

The substrate cleaning composition is an anhydrous composition which contains no water. After contaminating the substrate with polystyrene latex particles of 50 nm and cleaning the substrate with the organic solvent, the substrate is observed to find a suitable material as an organic solvent of a substrate cleaning composition. Furthermore, the Hansen solubility parameter of each organic solvent for polystyrene latex is compared.

Table 1 is a comparison table of the Hansen solubility parameter (HSP) for each organic solvent, such as molecular weight, boiling point, surface tension, viscosity, and polystyrene latex (PSL), based on an experiment.

$$\text{Relative HSP for PSL of organic solvent} = \frac{\text{HSP between organic solvent and PSL}}{\text{HSP for self-PSL}} \quad \text{(Equation 1)}$$

In the HSP, PSL particles are dissolved in each organic solvent when a value of Equation 1 is less than 1. When the value of Equation 1 is 1, the PSL particles are partially dissolved in the organic solvent and when the value exceeds 1, the PSL particles are not dissolved in the organic solvent. The HSP between the organic solvent and the PSL and the HSP for self-PSL should be calculated, respectively, to determine dissolving power of each organic solvent as shown in Equation 1. Here, a standard HSP for self-PSL is 12.0. Examples of HSP values between each organic solvent and the PSL are described in Table 1.

In an embodiment, the molecular weight of the organic solvent is preferably 200 g/mol or less. When the molecular weight is large, it is difficult to remove the organic solvent with CO2 used as the supercritical fluid. In addition, in an embodiment, the boiling point (BP) of the organic solvent is preferably 50° C. or more. A low boiling material presents an explosion hazard. In addition, in an embodiment, the surface tension of the organic solvent is 30 dyn/cm or less, preferably. When the surface tension is large, the pattern leaning and collapse of the circuit pattern may be caused. Since the higher the viscosity of the organic solvent, the more contaminated a pipe, the low viscosity of the organic solvent is preferable. The organic solvents satisfying the molecular weight, boiling point, surface tension, and viscosity condition and having the HSP of 5 to 12 or less may be n-butyl acetate (nBA), di-ethyl malonate, isopropyl Acetate. The organic solvent is not limited to the examples presented, and other anhydrous compositions may be selected that satisfy the conditions described above. It is also desirable that the organic solvent have affinity with the supercritical fluid.

In Table 1, Comparative Example 1 selects IPA as the organic solvent in the cleaning composition. In Comparative Example 2, Limonene is selected as the organic solvent in the cleaning composition. Example 1 selects n-butyl acetate (nBA) as the organic solvent in the cleaning composition. Example 2 selects di-ethyl malonate (DEM) as the organic solvent in the cleaning composition. Example 3 selects isopropyl acetate (IA) as the organic solvent in the cleaning composition.

contaminated with polystyrene latex particles of 50 nm, in the organic solvent for 30 seconds, applying the organic solvent or rinsing IPA for 30 seconds, and spin-drying. The cleaning power is evaluated by observing the cleaned substrate by SEM.

In IPA of Comparative Example 1 and Limonene of Comparative Example 2, it was observed that a large amount of particles remained on the substrate.

When the Hansen solubility parameter for the PSL was 12 or more, for example, when the substrate was cleaned with the IPA having the HSP of 14.6, it was confirmed that the particles were not removed by a target amount. Therefore, when the Hansen solubility index was 12 or more, it was determined that a reaction did not occur well due to a distance between molecules.

When the Hansen solubility parameter for the PSL was 5 or less, for example, when the substrate was cleaned with Limonene having the HSP of 4, it was observed that the particle size is reduced to cause secondary contamination on the substrate.

When the Hansen solubility parameter for the PSL was 5 or more and 12 or less, in particular, in a case of nba, di-ethyl malonate, and isopropyl acetate of 5 or more and 9 or less, it was confirmed that substrate cleaning efficiency was 80% or more.

Figure 5:
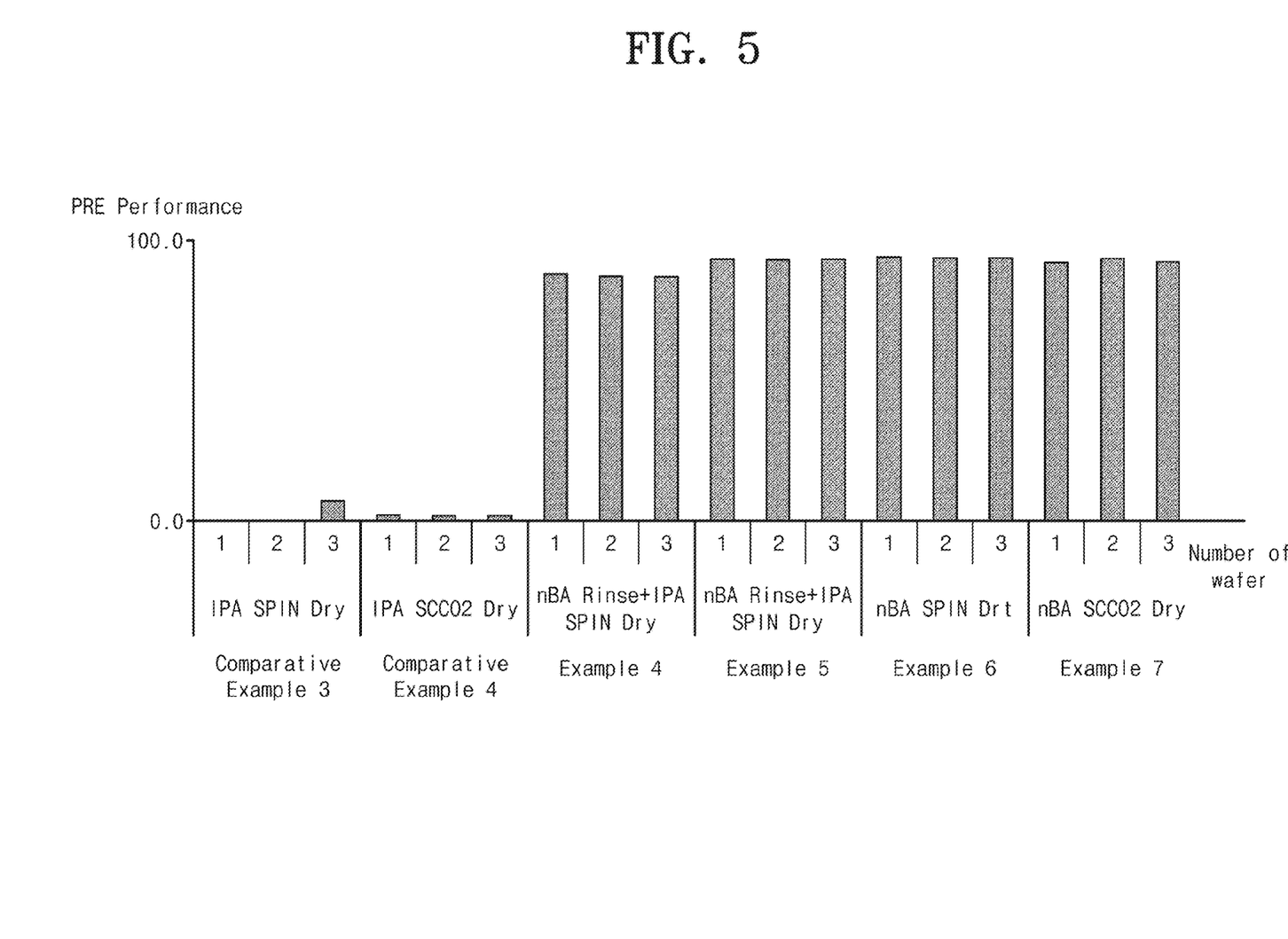
FIG. 5 is a graph illustrating particle removal performance with a result, in which cleaning a substrate applied with about 54,000 to 55,000 polystyrene latex particles using an organic solvent for 30 seconds, rinsing the substrate with the organic solvent, and spin-drying the substrate are performed, and a result, in which cleaning a substrate applied with about 54,000 to 55,000 polystyrene latex particles using an organic solvent for 30 seconds, rinsing the substrate with the organic solvent, and drying the substrate with supercritical carbon dioxide at 120 bar and 75° C. for 3 minutes are performed.

FIG. 5 is a graph illustrating particle removal performance with a result in which cleaning a substrate applied with about 54,000 to 55,000 polystyrene latex particles with organic solvent for 30 seconds, rinsing the substrate with organic solvent, and spin-drying the substrate are performed and a result in which cleaning a substrate applied with about 54,000 to 55,000 polystyrene latex particles with organic solvent for 30 seconds, rinsing the substrate with organic solvent, and drying the substrate with supercritical carbon dioxide at 120 bar and 75° C. for 3 minutes are performed.

According to Comparative Example 3, when the IPA was selected as the organic solvent and the substrate was spin-dried, PRE performance was low in the first sheet, the second sheet, and the third sheet. According to Comparative Example 4, when IPA was selected as an organic solvent and the substrate was dried with supercritical carbon dioxide, the PRE performance was low in the first sheet, the second sheet, and the third sheet.

When the substrate was rinsed with nBA and spin-dried with IPA according to Example 4, the PRE performance was relatively high in the first sheet, the second sheet, and the third sheet. When the substrate was rinsed with nBA and was

TABLE 1

| | Solvent | Molecular Weight [g/cm3] | BP(Boiling Point) [° C.] | Surface Tension [dyn/cm] | Viscosity [cP] | HSP (between Solvent-PSL) |
|---|---|---|---|---|---|---|
| Comparative Example 1 | IPA(Reference) | 60.1 | 83 | 21.7 | 1.96 | 14.6 |
| Comparative Example 2 | Limonene | 136.2 | 176 | 26 | 0.92 | 4.0 |
| Example 1 | nBA | 116.2 | 126 | 25.1 | 0.68 | 6.4 |
| Example 2 | Di-Ethyl Malonate | 160 | 199 | 31 | 1.33 | 7.9 |
| Example 3 | Isopropyl Acetate | 102.1 | 89 | 22.3 | 0.49 | 8.9 |

※ The HSP value shown in Table 1 represents the HSP between the organic solvent and the PSL. The HSP for self-PSL is 12.0.

Figure 4:
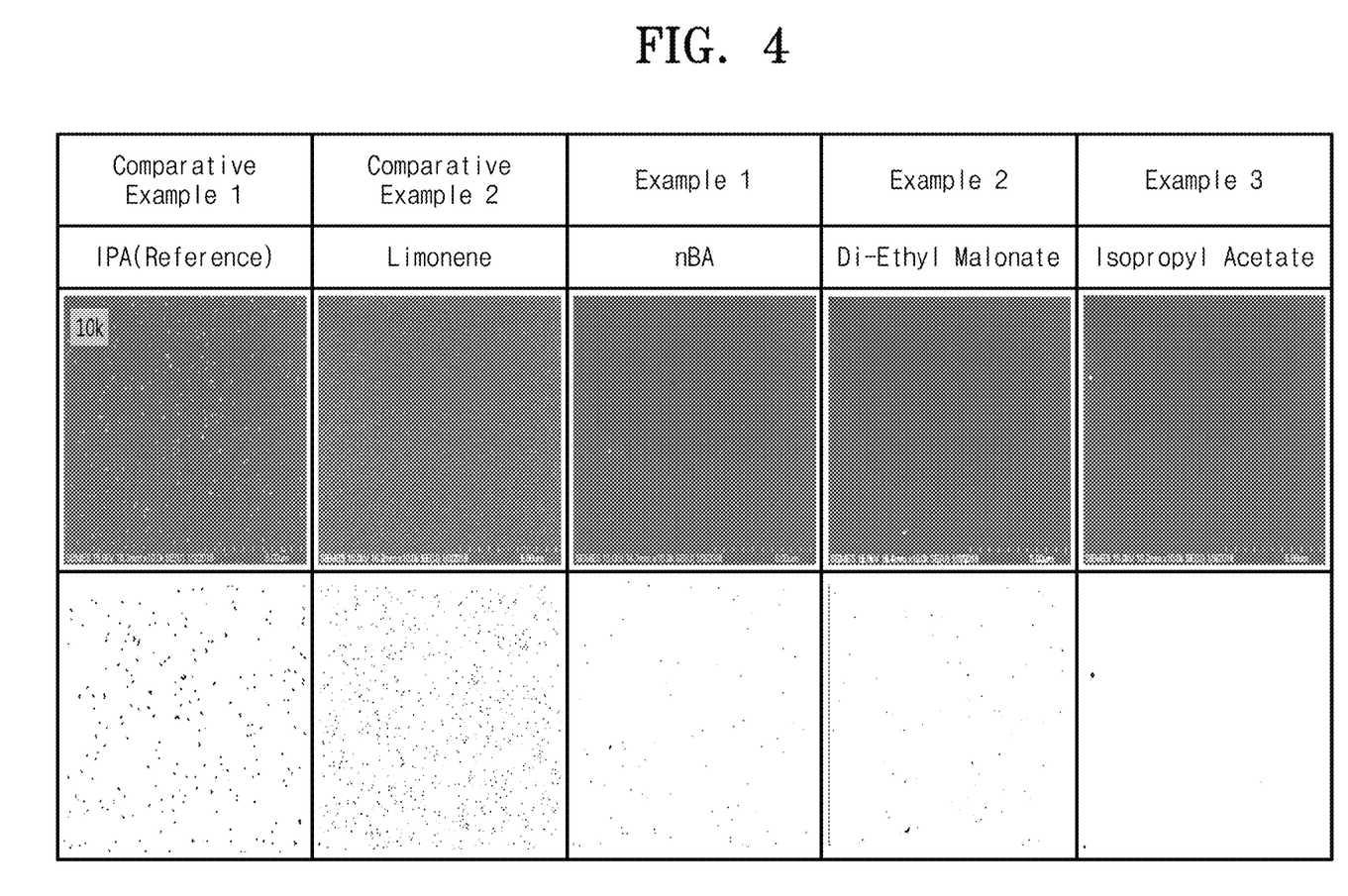
FIG. 4 is a comparison table comparing performance of cleaning compositions according to Examples.

FIG. 4 is a comparison table comparing performance of cleaning compositions according to Examples. An applied process recipe includes dipping the substrate, which is supercritically dried by mixing IPA and supercritical fluid according to Example 5, the PRE performance was higher than that of Example 4.

When the substrate was rinsed with nBA and was spin-dried according to Example 6, the high PRE performance was observed similarly to that of Example 5. When the substrate was rinsed with nBA and was dried with supercritical carbon dioxide, the high PRE performance was observed similarly to those of Examples 5 and 6.

That is, the high PRE performance was observed when the substrate was rinsed with nBA as the organic solvent. The high PRE performance was also observed for di-ethyl malonate and isopropyl acetate, which are materials with Hansen solubility parameter of 5 to 12 for the PSL.

The cleaning composition according to an embodiment may further include an etching compound dissolved in the organic solvent and a binder.

The etching compound provides fluorine which contributes to the substrate processing. The etching compound may be hydrogen fluoride (HF).

When the binder meets the particles, the binder is placed on an outer surface of each particle to form a micelle. In the process of cleaning the substrate, the particles separated from the substrate may be attached to the substrate again to reduce the cleaning efficiency. On the other hand, when the binder is located on the outer surface of each particle to form the micelle, the particles may be blocked from contacting the substrate, and the particles may be prevented from reattaching to the substrate. The binder may be a compound including phosphorus having a structural formula of O=P—(O—R)3, R:CH3-(CH2)n-1 (where n is a natural number of one or more) such as trimethyl phosphate and triethyl phosphate. In addition, the binder may be dimethyl sulfite or diethyl sulfite.

Figure 6:
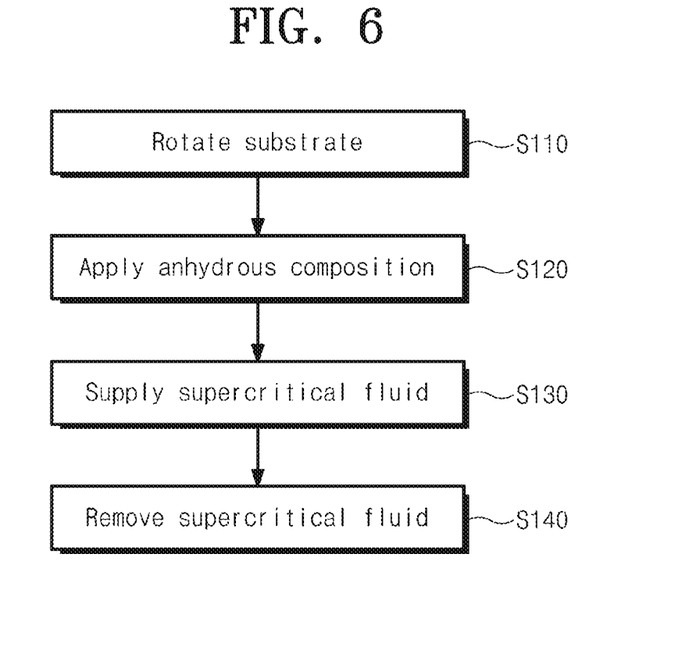
FIG. 6 is a flowchart illustrating a method of cleaning a substrate according to an embodiment.

FIG. 6 is a flowchart illustrating a method of cleaning a substrate according to an embodiment.

The substrate supported by the support unit 3100 of the first process chamber 3000 is rotated in S110. The anhydrous cleaning composition according to the embodiment is applied to the rotated substrate 'S'. The cleaning composition may be the organic solvent according to the embodiment in S120. The substrate applied with the cleaning composition is transferred to the second process chamber 4000 to supply the supercritical fluid for a predetermined time in S130. After the set time elapses, the supercritical fluid is removed in S140.

Figure 7:
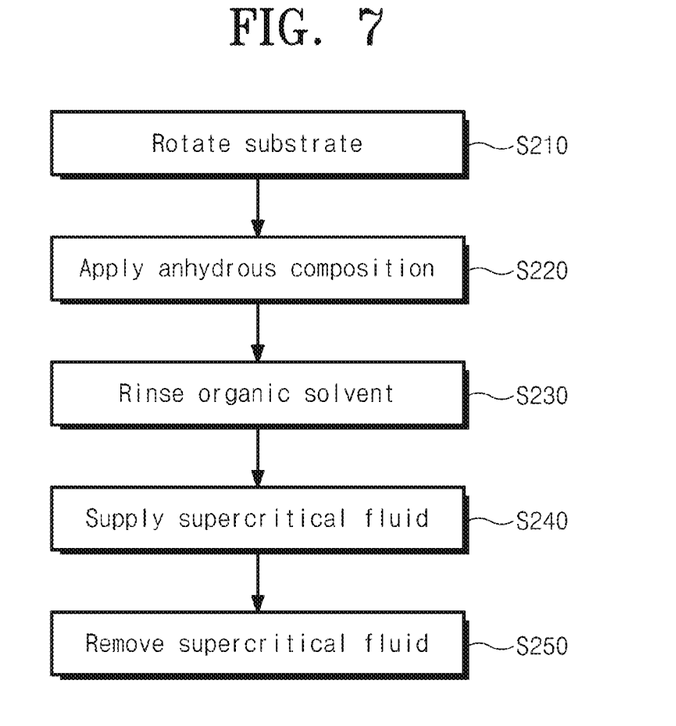
FIG. 7 is a flowchart illustrating a method of cleaning a substrate according to another embodiment.

FIG. 7 is a flowchart illustrating a method of cleaning a substrate according to another embodiment.

The substrate supported by the support unit 3100 of the first process chamber 3000 is rotated in S210. The anhydrous cleaning composition according to the embodiment is applied to the rotated substrate 'S'. The anhydrous cleaning composition may be the organic solvent according to the embodiment in S220. The substrate on which the cleaning composition is applied is rinsed with the organic solvent. The organic solvent may be IPA in S230. The substrate rinsed with the organic solvent is transferred to the second process chamber 4000 to supply the supercritical fluid for a predetermined time in S240. After the set time elapses, the supercritical fluid is removed in S250.

According to an embodiment of the inventive concept, the substrate may be effectively processed.

In addition, according to an embodiment of the inventive concept, the cleaning efficiency of the substrate is improved.

In addition, according to an embodiment of the inventive concept, the pattern collapse of the substrate is prevented.

In addition, according to an embodiment of the inventive concept, the particles each having the nano-scale (100 nm or less) size may be effectively removed.

In addition, according to an embodiment of the inventive concept, an organic residue of a deep trench may be removed without pattern collapse while the silicon-based layer ($SiO_2$, $Si_3O_4$) are not damaged.

The above detailed description illustrates the invention. In addition, the above-mentioned contents show preferred embodiments of the inventive concept, and the inventive concept may be used in various other combinations, modifications, and environments. That is, changes or modifications may be made within the scope of the concept of the invention disclosed in the present specification, the scope equivalent to the disclosures described above, and/or the skill or knowledge in the art. The described embodiments illustrate the best state for implementing the technical idea of the inventive concept, and various modifications required in the specific application field and use of the inventive concept are possible. Thus, the detailed description of the invention is not intended to limit the invention to the disclosed embodiments. Also, the appended claims should be construed to include other embodiments.

What is claimed is:

1. A method of processing a substrate, the method comprising:
    rotating the substrate;
    applying a cleaning composition to the substrate while the substrate is rotated, the cleaning composition including an organic solvent having a Hansen solubility parameter for polystyrene latex between 5 and 12; and
    supplying a processing fluid comprising a mixture of the cleaning composition and a supercritical fluid to the substrate to which the cleaning composition was applied to process the substrate,
    wherein the cleaning composition is provided by dissolving an etching compound comprising fluorine in the organic solvent, and
    wherein the cleaning composition further includes a binder comprising a compound including phosphorus.

2. The method of claim 1, wherein the organic solvent includes one of n-butyl acetate, diethyl malonate, isopropyl acetate, or a combination thereof.

3. The method of claim 1, wherein the organic solvent has a surface tension of 30 dyn/cm or less.

4. The method of claim 1, wherein the binder includes trimethyl phosphate.

5. The method of claim 1, wherein the cleaning composition is provided in an anhydrous composition containing no water as a component.

6. The method of claim 1, further comprising:
    rinsing the substrate to which the cleaning composition is applied with the organic solvent before the supplying of the processing fluid.

7. The method of claim 1, wherein the etching compound includes hydrogen fluoride.

8. The method of claim 1, wherein the applying the cleaning composition to the substrate, while the substrate is rotated, is performed in a first process chamber, and
    wherein the supplying of the processing fluid is performed in a second process chamber, which is spaced apart from the first process chamber.

* * * * *